United States Patent
Katou

(10) Patent No.: US 12,222,458 B2
(45) Date of Patent: Feb. 11, 2025

(54) APPARATUS FOR DETERMINING ORIENTATION AND POSITION OF SENSOR

(71) Applicant: DENSO CORPORATION, Kariya (JP)

(72) Inventor: Kazuki Katou, Kariya (JP)

(73) Assignee: DENSO CORPORATION, Kariya (JP)

( * ) Notice: Subject to any disclaimer, the term of this patent is extended or adjusted under 35 U.S.C. 154(b) by 189 days.

(21) Appl. No.: 17/822,369

(22) Filed: Aug. 25, 2022

(65) Prior Publication Data

US 2022/0413112 A1 Dec. 29, 2022

Related U.S. Application Data

(63) Continuation of application No. PCT/JP2021/006595, filed on Feb. 22, 2021.

(30) Foreign Application Priority Data

Feb. 28, 2020 (JP) .................. 2020-032762

(51) Int. Cl.
  *G01S 7/497* (2006.01)
  *G01S 17/86* (2020.01)
  *G01S 17/931* (2020.01)

(52) U.S. Cl.
  CPC ............ *G01S 7/4972* (2013.01); *G01S 17/86* (2020.01); *G01S 17/931* (2020.01)

(58) Field of Classification Search
  CPC ............ G01S 17/86; G01S 13/931; G01S 2013/932; G01S 13/86; G01S 13/723; G01S 13/867; G01S 13/87; G01S 2013/9316; G01S 2013/9318; G01S 2013/93185; G01S 2013/9319; G01S 2013/9321; G01S 2013/9322; G01S 2013/9325; G01S 2013/93271; G01S 17/89; G01S 17/931; G01S 7/4816; G01S 17/46; G01S 7/4863; G01S 17/88; G01S 15/87; G01S 15/88; G01S 17/42; G01S 17/04; G01S 7/4802;
  (Continued)

(56) References Cited

U.S. PATENT DOCUMENTS

| | | | |
|---|---|---|---|
| 7,430,489 B2 * | 9/2008 | Fager | G01S 5/0247 702/152 |
| 10,823,821 B2 * | 11/2020 | Fechner | G01S 17/931 |
| 2013/0079983 A1 * | 3/2013 | Ehlgen | B60Q 1/14 348/148 |
| 2017/0045889 A1 | 2/2017 | Yamaguchi et al. | |
| 2017/0273161 A1 | 9/2017 | Nakamura | |

(Continued)

FOREIGN PATENT DOCUMENTS

| | | | | |
|---|---|---|---|---|
| CN | 104838644 A | * | 8/2015 | ............... G02B 5/20 |
| CN | 110352493 A | * | 10/2019 | ............. G01S 17/46 |

(Continued)

*Primary Examiner* — Michael P Stafira
(74) *Attorney, Agent, or Firm* — Maschoff Brennan

(57) ABSTRACT

An orientation-position determining device is provided which is used for a sensor installed in a vehicle. The orientation-position determining device includes an imaging unit and an orientation-position detector. The imaging unit works to obtain a ranging image and an ambient light image from the sensor. The ranging image represents a distance to a target lying in a light emission region to which light is emitted from the sensor. The ambient light image represents an intensity of ambient light and has a resolution higher than that of the ranging image. The orientation-position detector works to use the ranging image and the ambient light image to detect an orientation and/or a position of the sensor.

9 Claims, 14 Drawing Sheets

(58) Field of Classification Search
CPC .......... G01S 13/04; G01S 15/04; G01S 15/06;
G01S 7/417; G01S 7/539; G01S 17/10;
G01S 17/894; G01S 5/16; G01S 7/4817;
G01S 7/484; G01S 17/66; G01S 15/42;
G01S 7/481; G01S 7/4868; G01S 17/48;
G01S 7/4808; G01S 7/4815; G01S 11/12;
G01S 13/726; G01S 13/89; G01S 17/00;
G01S 17/36; G01S 5/163; G01S 7/4972;
G01S 19/44; G01S 3/781; G01S 5/18;
G01S 7/22; G01S 7/4814; G01S 7/497;
G01S 11/14; G01S 19/485; G01S 3/784;
G01S 3/786; G01S 7/4811; G01S 7/4914;
G01S 13/426; G01S 2013/9314; G01S
5/0249; G01S 7/046; G01S 7/10; G01S
7/2955; G01S 17/06; G01S 17/34; G01S
17/933; G01S 3/783; G01S 7/003; G01S
7/4804; G01S 7/4865; G01S 17/32; G01S
17/50; G01S 17/58; G01S 7/4876; G01S
7/493; G01S 13/08; G01S 15/08; G01S
15/10; G01S 17/08; G01S 17/93; G01S
2015/934; G01S 2015/935; G01S 3/782;
G01S 7/021; G01S 7/4026; G01S 7/4082;
G01S 7/4812; G01S 7/4818; G01S 7/483;
G01S 7/486; G01S 7/4861; G01S 7/4911;
G01S 7/4918; G01S 7/51
See application file for complete search history.

(56) References Cited

U.S. PATENT DOCUMENTS

| | | | |
|---|---|---|---|
| 2018/0180733 A1* | 6/2018 | Smits | G06T 7/521 |
| 2019/0266425 A1 | 8/2019 | Wai et al. | |
| 2019/0339361 A1* | 11/2019 | Fechner | G01S 13/931 |

FOREIGN PATENT DOCUMENTS

| | | | | | |
|---|---|---|---|---|---|
| CN | 110677596 A | * | 1/2020 | | G01J 1/4204 |
| EP | 1666919 A2 | * | 6/2006 | | G01S 13/867 |
| GB | 2370958 A | * | 7/2002 | | G06T 5/50 |
| JP | 2014-181957 A | | 9/2014 | | |
| TW | I503518 B | * | 10/2015 | | |
| WO | WO-2015113550 A1 | * | 8/2015 | | B60R 25/2081 |
| WO | WO-2015125300 A1 | * | 8/2015 | | G01C 11/02 |
| WO | WO-2016067280 A1 | * | 5/2016 | | B60Q 1/14 |
| WO | 2017122529 A1 | | 7/2017 | | |
| WO | WO-2019017243 A1 | * | 1/2019 | | G01C 3/02 |
| WO | WO-2020033749 A1 | * | 2/2020 | | G01J 1/4204 |

* cited by examiner

APPARATUS FOR DETERMINING ORIENTATION AND POSITION OF SENSOR

CROSS REFERENCE TO RELATED DOCUMENT

The present application claims the benefit of priority of Japanese Patent Application No. 2020-032762 filed on Feb. 28, 2020, the disclosure of which is incorporated in its entirety herein by reference.

TECHNICAL FIELD

This disclosure in this application relates generally to technology for determining an orientation and position of sensors installed in vehicles.

BACKGROUND ART

In order to enhance the certainty of outputs from two sensors which are installed in a vehicle and different in type and resolution from each other, there have been proposed techniques which combine outputs from the sensors in order to obtain calibration parameters for orientations and positions of the sensors (e.g., International publication No. WO2017122529(A1)).

The sensors, as taught in the above publication, are heterogeneous sensors, which may result in no overlap or an undesirably small overlap between sensing regions thereof. Such an event may lead to a risk that outputs from the sensors may be insufficient to derive the calibration parameters, thus resulting in a decreased accuracy of the calibration parameters. Accurate measurement of at least one of the orientation and position of each of the sensors mounted in the vehicle is, therefore, sought.

SUMMARY OF THE INVENTION

This disclosure may be embodied in the following aspects.

According to an embodiment in this disclosure, there is provided an orientation-position determining apparatus for a sensor installed in a vehicle which comprises: an imaging unit which obtains a ranging image and an ambient light image from the sensor, the ranging image representing a distance to a target lying in a light emission region to which light is emitted from the sensor, the ambient light image representing an intensity of ambient light and having a resolution higher than or equal to that of the ranging image; and (b) an orientation-position detector which is configured to use the ranging image and the ambient light image to detect an orientation and/or a position of the sensor.

The orientation-position determining apparatus derives the ranging image and the ambient light image which is higher in resolution than or equal to the ranging image from the sensor and uses the ranging image and the ambient light image to determine the orientation and/or the position of the sensor. In other words, the determination of the orientation and/or the position of the sensor is achieved only using an output from the sensor, thereby resulting in a higher accuracy in determining the orientation and/or the position of the sensor than using outputs from two different types of sensors.

This disclosure may be realized in a variety of modes, for example, by an orientation-position determining method, an orientation-position determining program, or a computer-readable storage medium in which the orientation-position determining program is stored.

BRIEF DESCRIPTION OF THE DRAWINGS

The above-described object, and other objects, features, or beneficial advantages in this disclosure will be apparent from the appended drawings or the following detailed discussion.

EMBODIMENTS FOR CARRYING OUT THE INVENTION

First Embodiment

Figure 1:
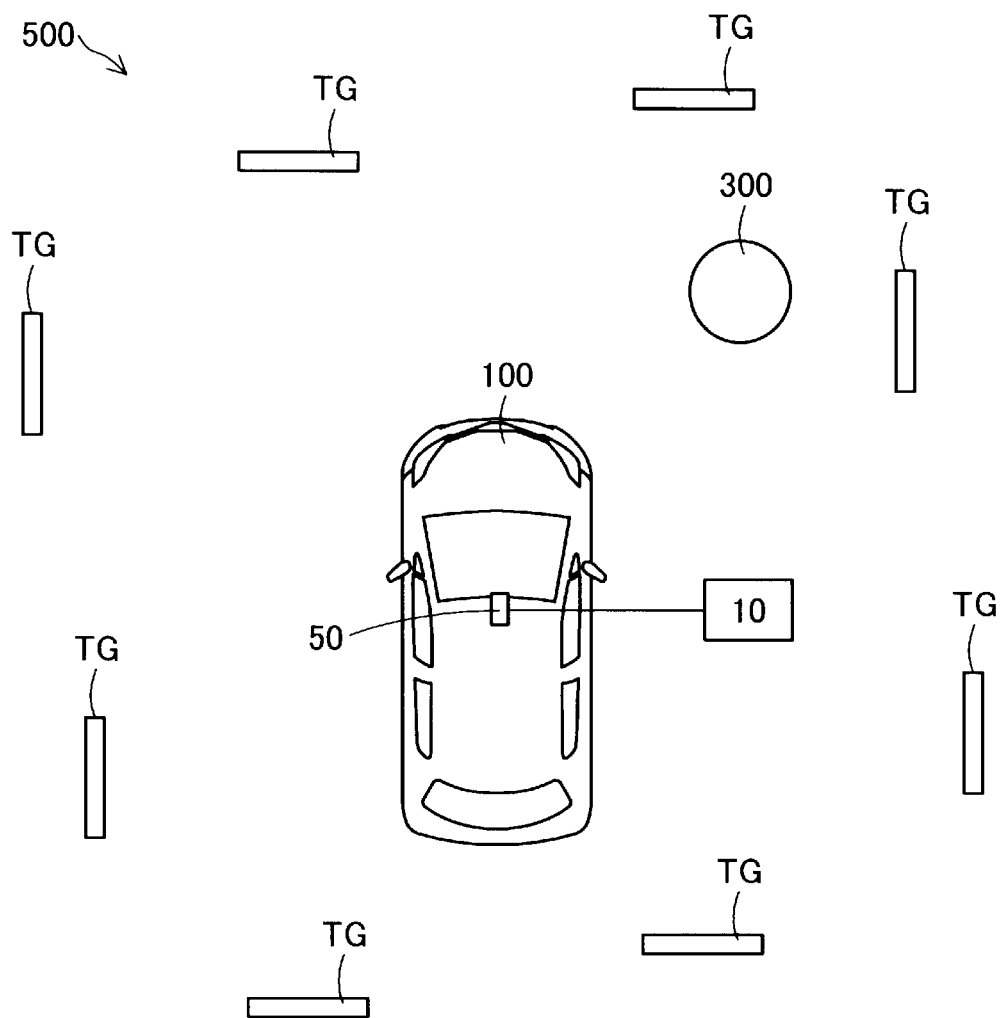
FIG. 1 is an explanatory view which schematically illustrates a structure of an orientation-position determining system according to an embodiment of this disclosure.
Figure 2:
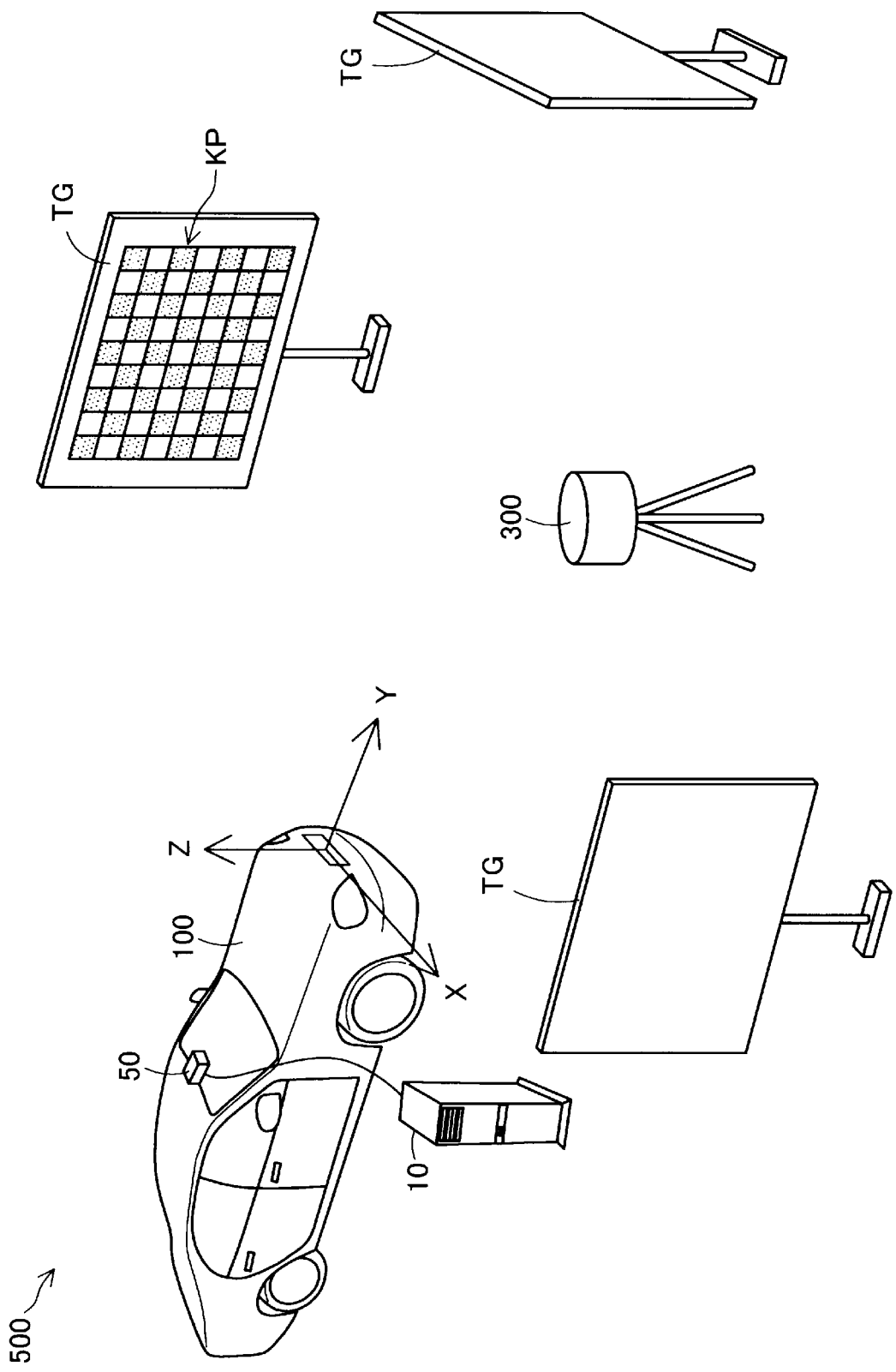
FIG. 2 is an explanatory view which schematically illustrates a structure of an orientation-position determining system for a sensor.

The orientation-position determining system 500 is, as can be seen in FIGS. 1 and 2, used with the sensor 50 installed in the vehicle 100 and includes a plurality of targets TG, the orientation-position determining device 10, and the measuring device 300. The targets TG are physical marks each of which is used to measure at least one of the orientation (i.e., attitude relative to a reference orientation) and position of the sensor 50. The targets TG are arranged around the vehicle 100. In the orientation-position determining system 500, each of the orientation-position determining device 10 and the measuring device 300 works to determine a position of each target TG in a coordinate system defined in three-dimensional space using one or some features on each target TG. The orientation-position determining system 500 calculates a difference between the positions of each target TG in the coordinate system which are measured by the orientation-position determining device 10 and the measuring device 300 to determine the orientation and/or position of the sensor 50 relative to a reference coordinate axis which will be described later in detail. The term "orientation-position", as referred to in this disclosure, represents at least one of the orientation and position of the sensor 50.

Figure 3:
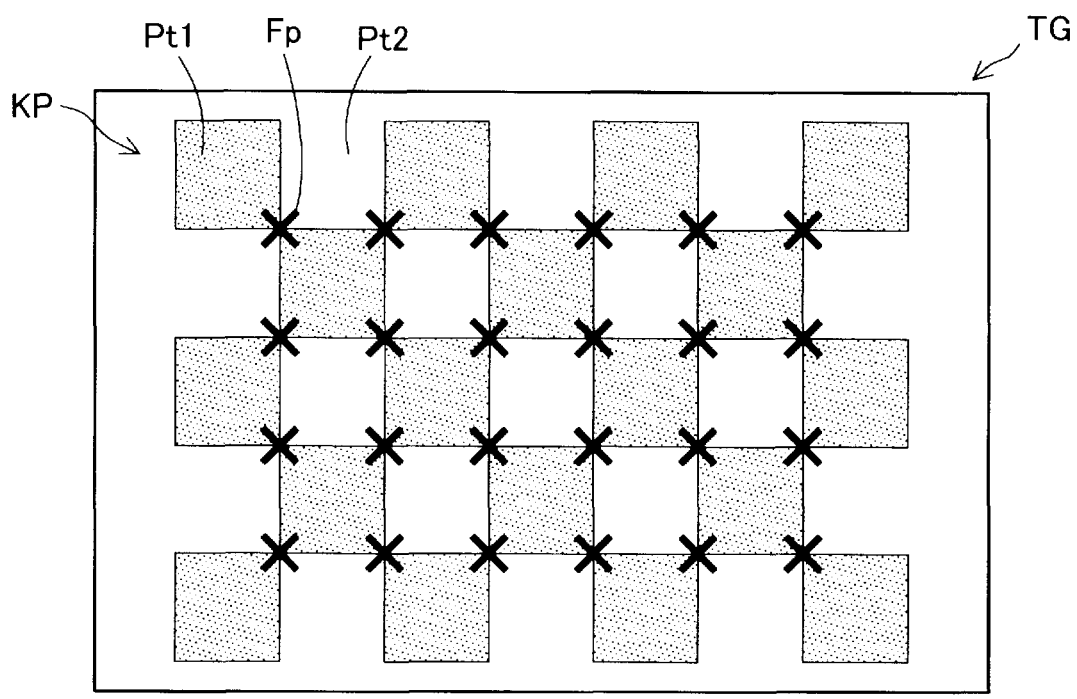
FIG. 3 is an explanatory view which shows an example of a target.

The targets TG are, as illustrated in FIG. 2, flat boards each of which has a pre-designed detection pattern KP on a surface thereof. Specifically, each of the targets TG has the checkboard pattern KP on the surface facing the vehicle 100. The detection pattern KP is, as clearly illustrated in FIG. 3, formed using a plurality of elements arranged in a lattice-shape. More specifically, the detection pattern KP includes black elements PH and white elements Pt2 which are alternately arranged. Marks expressing feature points Fp are provided on intersections between the elements PH and Pt2. Each of the black elements PO is located adjacent to one of the white elements Pt2. In other words, the elements PO and Pt2 which are different in brightness from each other are disposed adjacent to each other, thereby facilitating the ease with which edges of an ambient light image (which will be described later in detail) are detected, which achieve accurate determination of pixel positions of the feature points Fp on the ambient light image.

The orientation-position determining device 10 works to perform an orientation-position determining task, as will be described later, to determine the orientation and/or position of the sensor 50. Specifically, the orientation-position determining device 10 uses an output from the sensor 50, i.e., the ambient light image or a ranging image (which will be described later in detail) to calculate distances to the feature points Fp on each target TG and converts the distances into three-dimensional positions thereof. The orientation-position determining device 10 compares the three-dimensional positions and a three-dimensional position derived by the measuring device 300 to calculate the orientation and/or position of the sensor 50 relative to reference coordinate axes which will be described later in detail.

The orientation-position determining device 10 works to analyze the position of the vehicle 100 derived by the measuring device 300 to determine axes of coordinate (i.e., the reference coordinate axes) used as a basis for calculating the orientation and/or position of the sensor 50. The orientation-position determining device 10 uses the positions of the feature points Fp on the target TG derived by the measuring device 300 to calculate three-dimensional positions (which will also be referred to as reference positions) of the feature points Fp on the reference coordinate axes. Specifically, the orientation-position determining device 10 measures positions and orientations of four road wheels of the vehicle 100 using the measuring device 300 to calculate orientations of the reference coordinate axes. The orientation-position determining device 10 also detects the feature points Fp on each target TG using the measuring device 300 and calculate three-dimensional positions (i.e., coordinates x, y, and z) of the feature points Fp on the target TG in a coordinate system defined by the reference coordinate axes. The orientation-position determining device 10 defines the three-dimensional positions of the feature points Fp derived by the measuring device 300 as the reference positions. The measuring device 300 is implemented by, for example, a total station. The origin of the coordinate system defined by the reference coordinate axes is defined on a front end of the vehicle 100 with reference to a specification table of the vehicle 100 and the position of an emblem attached to the front of the vehicle, as derived by the measuring device 300. The origin may alternatively be selected on the center of a rear axle of the vehicle 100.

The sensor 50 is mounted on a front portion of a roof of the vehicle 100 and works to emit light and receive a return of the light reflected by a target object. The sensor 50 also receives light (which will also be referred to below as background light or ambient light) other than the light reflected from the target object, such as sunlight, street light, light emitted from headlights of another vehicle, and/or returns of such lights reflected from the target object. The sensor 50 removes the ambient light from the received light and determines it as light (also referred to as target-reflected light) arising from reflection of the emitted light from the target object and calculates the time, i.e., TOF (Time of Flight) it takes for the emitted light to travel to and from the target object. The sensor 50 uses the TOF to calculate the distance to the target object. Consequently, the orientation-position determining device 10 obtains a reflection-intensity image expressed by pixels having pixel values representing the intensity of the target-reflected light, the ambient light image expressed by pixels having pixel values representing the intensity of the received ambient light, and the ranging image representing the distance to the target object and uses these images to detect the target object. In this embodiment, the sensor 50 is implemented by a LiDAR (i.e., Light Detection and Ranging). The sensor 50 is mounted on a radiator grill, a front window, a front bumper, a rear window, a rear bumper, a front fender, or a refer fender of the vehicle 100. Alternatively, a plurality of sensors 50 may be installed on the above locations.

Although not illustrated in FIGS. 1 and 2, the vehicle 100 may also be equipped with a control system working to perform driving assistance or automated driving and/or a data processing device working to process data inputted from the sensor 50. The orientation-position determining device 10 may alternatively be installed directly in the vehicle 100.

Figure 4:
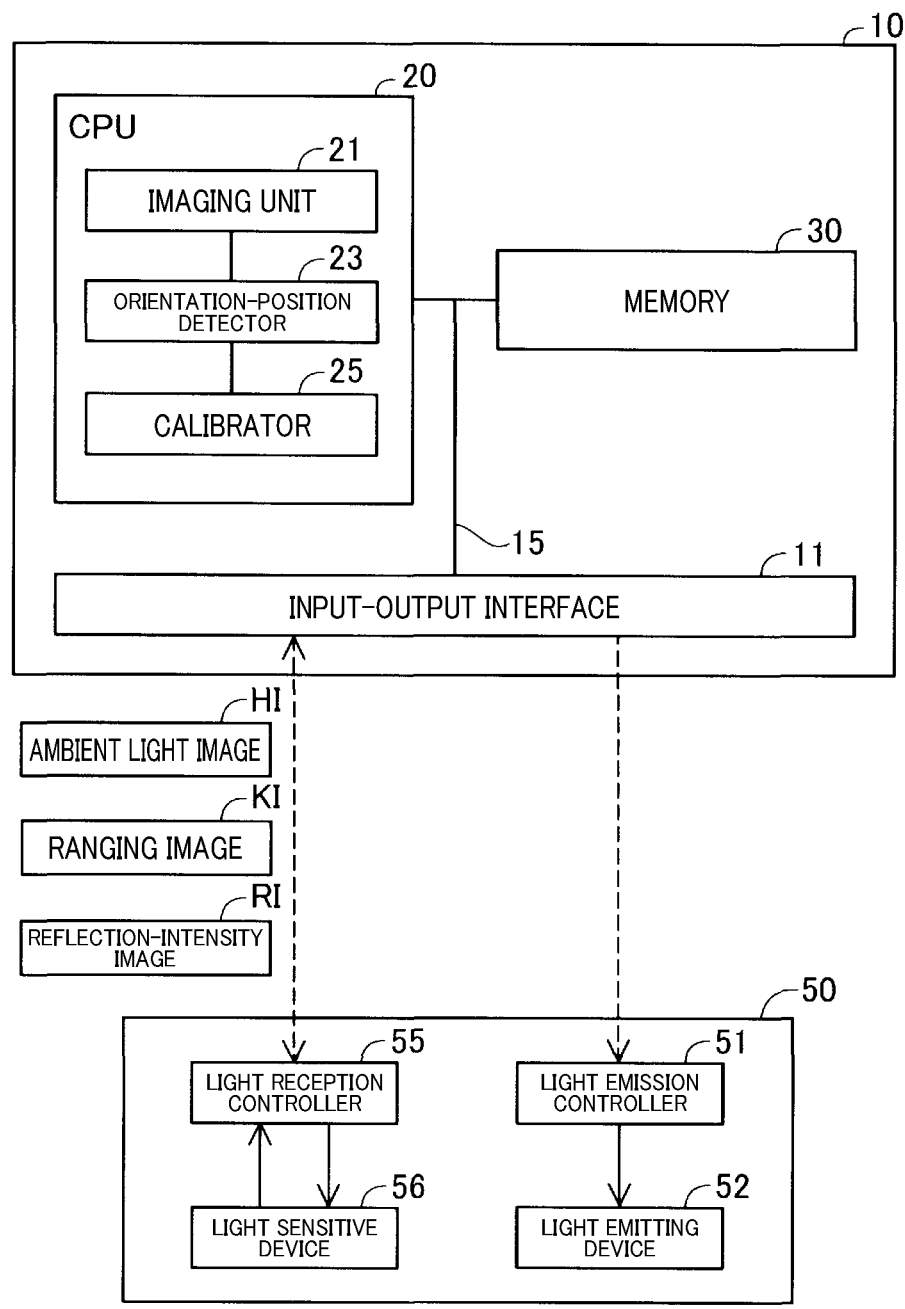
FIG. 4 is a block diagram which schematically illustrates a structure of an orientation-position determining device.

The orientation-position determining device 10 is, as illustrated in FIG. 4, made of a general-purpose computer equipped with the CPU 20, the memory 30, and the input-output interface 11. The CPU 20, the memory 30, and the input-output interface 11 are connected to each other using the bus 15 to be communicable with each other. The memory 30 includes a ROM, a RAM, and an EEPROM. The input-output interface 11 is connected to the light emission controller 51 and the light reception controller 55 using control signal lines. The light emission controller 51 and the light reception controller 55 are installed in the sensor 50.

The light emission controller 51 works to drive the light emitting device 52 to emit light at a time when a light emission signal, as outputted from the orientation-position determining device 10, is inputted to the light emission controller 51. The light emitting device 52 is made of, for example, an infrared laser diode and emits light in the form of an infrared laser beam which will also be referred to as LiDAR light. The light emission controller 51 may alternatively include a plurality of light emitting devices 52. The light emitted by the light emitting device 52 is reflected by a target object existing in a light emission region of the sensor 50. The light sensitive device 56 receives light including reflected light arising from reflection of the emitted light on the target object and the ambient light.

The light reception controller 55 is responsive to a light reception signal, as inputted from the orientation-position determining device 10, to derive received-light values of light entering the light sensitive device 56 on a pixel basis and outputs an ambient light image HI, a ranging image KI, and a reflection-intensity image RI. The term ambient light image H1, as referred to herein, means an image having pixel values representing a luminance indicating an intensity of and a quantity (i.e., luminous energy) of light received by the light sensitive device 56 in a condition where the light emitting device 52 emits no light. The ambient light image HI is derived immediately, for example, before the light emission controller 51 starts driving the light emitting device 52. The term ranging image KI means an image having a pixel value indicating a distance to a group of detected points where at least a portion of a target object identified by the target-reflected light. The term reflection-intensity image RI means an image having pixel values representing a luminance indicating an intensity of and a quantity (i.e., luminous energy) of light which arises from reflection of light, as emitted by the light emitting device 52, on a target object, that is, the target-reflected light received by the light sensitive device 56.

Figure 5:
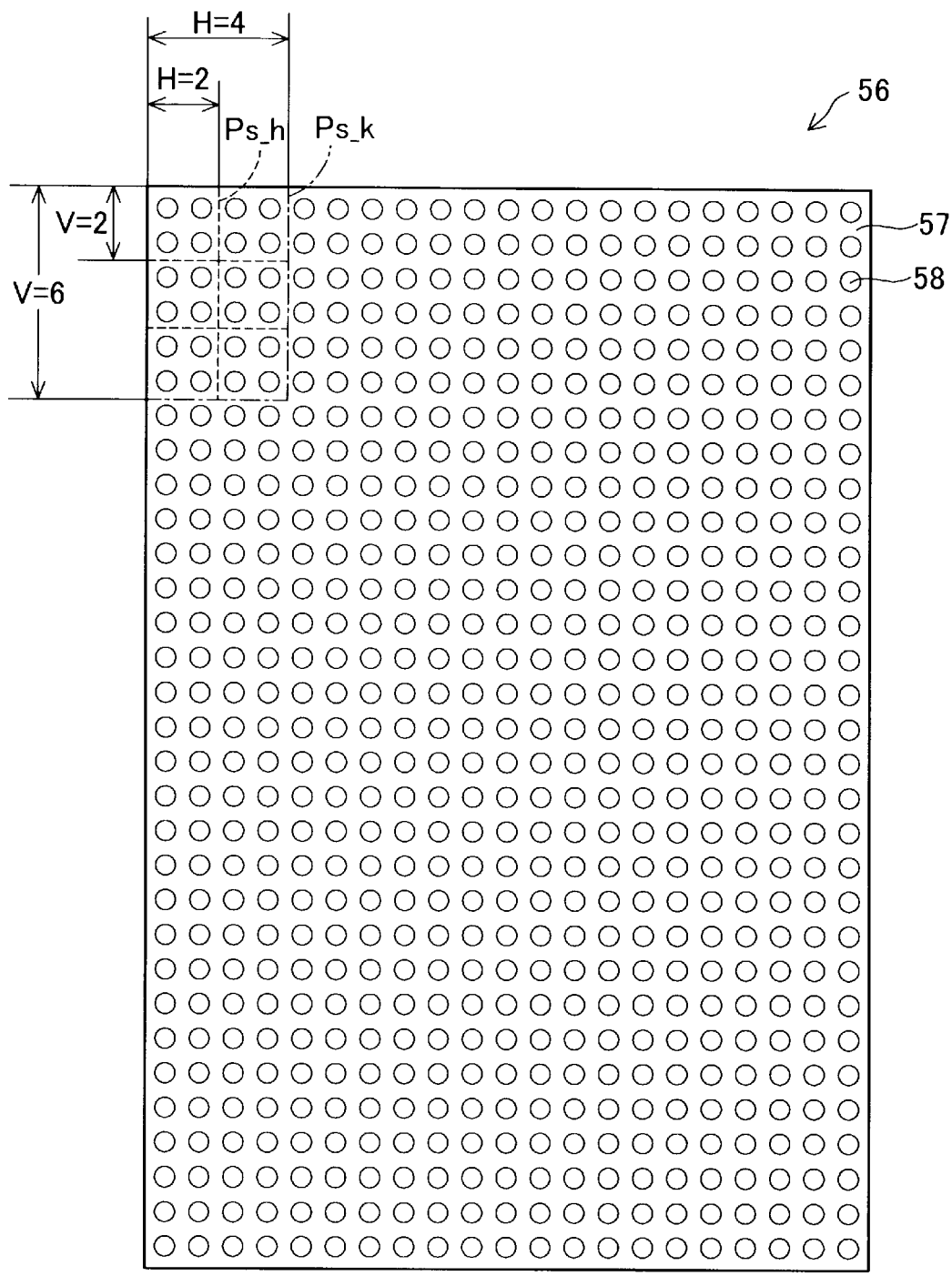
FIG. 5 is an explanatory view which illustrates a structure of a light sensitive device.

The light sensitive device 56 is, as clearly illustrated in FIG. 5, made of a plurality of photosensitive elements 58 arranged two-dimensionally on the light-receiving surface 57 in the form of a photosensor array. The photosensitive elements 58 are made of, for example, SPADs (Single-Photon Avalanche Diodes). The photosensitive elements 58 may alternatively be made of another type of photosensors, such as PIN photodiodes or APDs (avalanche photodiodes). The light reception controller 55 breaks down the photosensitive elements 58 arrayed on the light-receiving surface 57 into a plurality of pixels Ps which are arranged two-dimensionally and each of which includes horizontally arrays each of which consists of H photosensitive elements 58 and vertical arrays each of which consists of V photosensitive elements 58. Each of the pixels Ps consists of H×V photosensitive elements 58. Outputs of the H×V photosensitive elements 58 are provided as a pixel value of a corresponding one of the pixels Ps. "H" and "V" each represent an integer more than or equal to one. The number (H×V) of the photosensitive elements 58 of each of the pixels Ps will also be referred to as a pixel size. The smaller the pixel size, the higher the resolution (pixels/deg.) of the pixels used to sense light including the target-reflected light, thereby resulting in an increased resolution of a derived image.

The pixel size of one pixel Ps that corresponds to the number (H×V) of the photosensitive elements 58 of each pixel Ps is predetermined by the light reception controller 55. In this embodiment, the resolution of the ambient light image HI is selected to be higher than those of the ranging image KI and the reflection-intensity image RI. Specifically, the pixel Ps_h, as denoted by a broken line in FIG. 5, has a pixel size of H=V=2 and constitutes each pixel of the ambient light image HI. The pixel Ps_k, as denoted by an alternate long and short dash line in FIG. 5, has a pixel size of H=4 and V=6 and constitutes each pixel of each of the ranging image KI and the reflection-intensity image RI. The resolution of the pixel Ps_h is, therefore, higher than that of the pixel Ps_k. Outputs of the H×V photosensitive elements 58 of each pixel Ps whose pixel size is defined in the above manner are transmitted to the light reception controller 55 as representing a pixel value of a corresponding one of the pixels Ps. The ambient light image HI which is higher in resolution than the ranging image KI is, therefore, produced and outputted by the light sensitive device 56.

Figure 6:
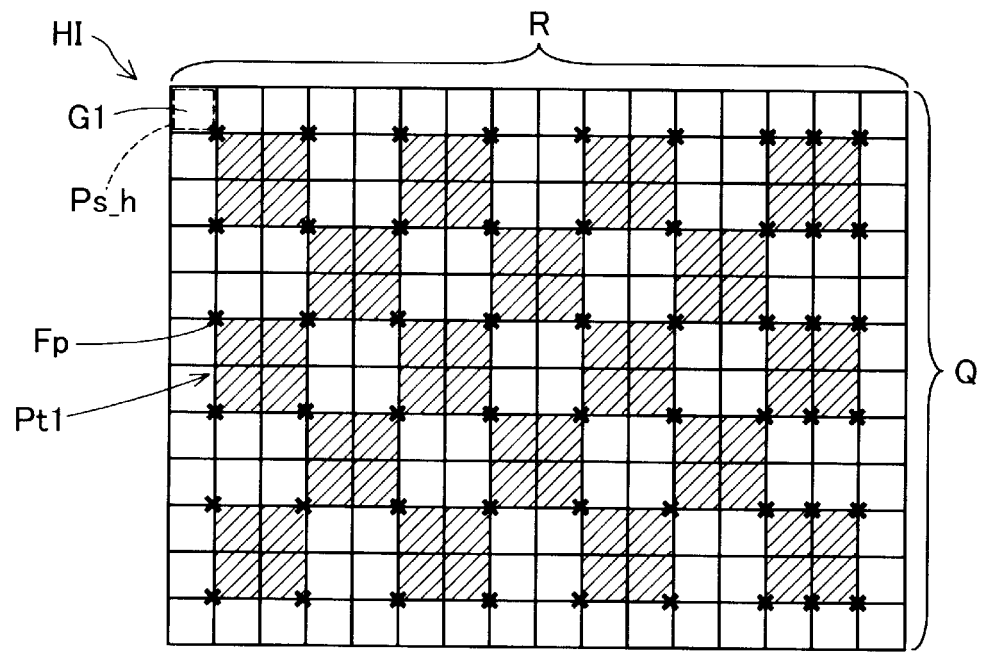
FIG. 6 is an explanatory view which schematically illustrates an example of an ambient light image.
Figure 7:
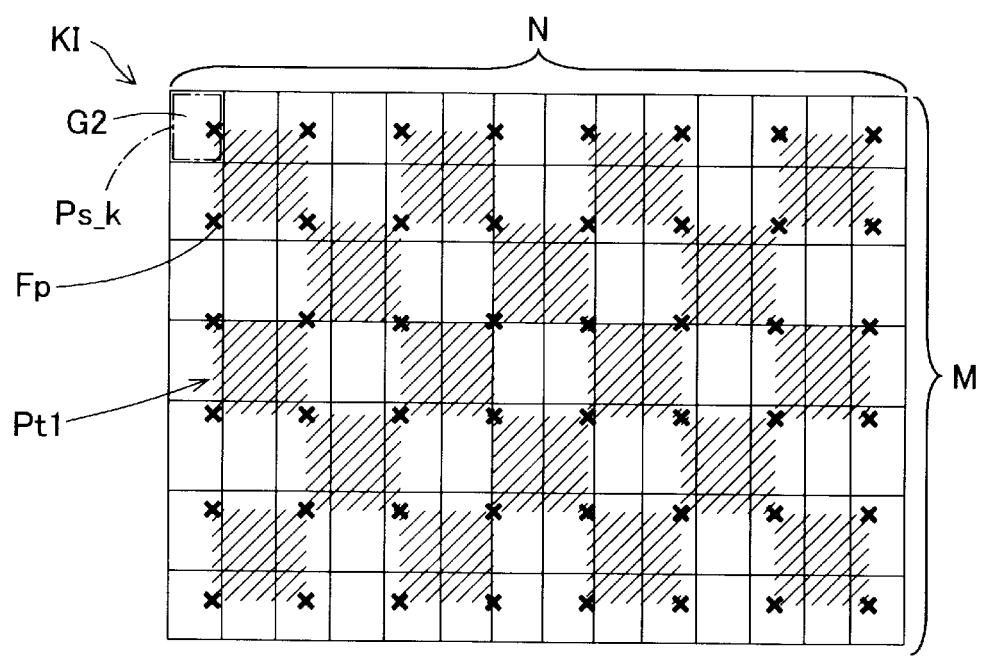
FIG. 7 is an explanatory view which schematically illustrates an example of a ranging image.

FIG. 6 demonstrates the ambient light image HI of the target TG. FIG. 7 demonstrates the ranging image KI of the target TG. The ambient light image HI is defined by pixels G1 each of which corresponds to the pixel Ps_h consisting of the four photosensitive elements 58. The ranging image KI is defined by pixels G2 each of which corresponds to the pixel Ps_K consisting of the six photosensitive elements 58. Therefore, the number R of the pixels Ps_h arrayed in the horizontal direction in the ambient light image HI is larger than the number N of the pixels Ps_k arrayed in the horizontal direction in the ranging image KI. The number Q of the pixels Ps_h arrayed in the vertical direction in the ambient light image HI is larger than the number M of the pixels Ps_k arrayed in the vertical direction in the ranging image KI. The pixel sizes of the pixels Ps_k and Ps_h are not limited to the above-described numbers, but may be optionally selected as long as a relation of 0<Ps_h<Ps_K is met.

The CPU 20 works to execute programs stored in the memory 30 to function as the imaging unit 21, the orientation-position detector 23, and the calibrator 25.

The imaging unit 21 obtains the ambient light image HI, the ranging image KI, and the reflection-intensity image RI from the sensor 50. The orientation-position detector 23 compares the three-dimensional positions of the feature points Fp, as derived using the ambient light image HI and the ranging image KI, with the reference position to determine the orientation and/or position of the sensor 50 on the reference coordinate axes. The calibrator 25 works to calibrate the orientation and/or position of the sensor 50 to cancel a difference(s) between the orientation and/or position of the sensor 50 derived by the orientation-position detector 23 and predetermined reference orientation and/or position of the sensor 50.

Figure 8:
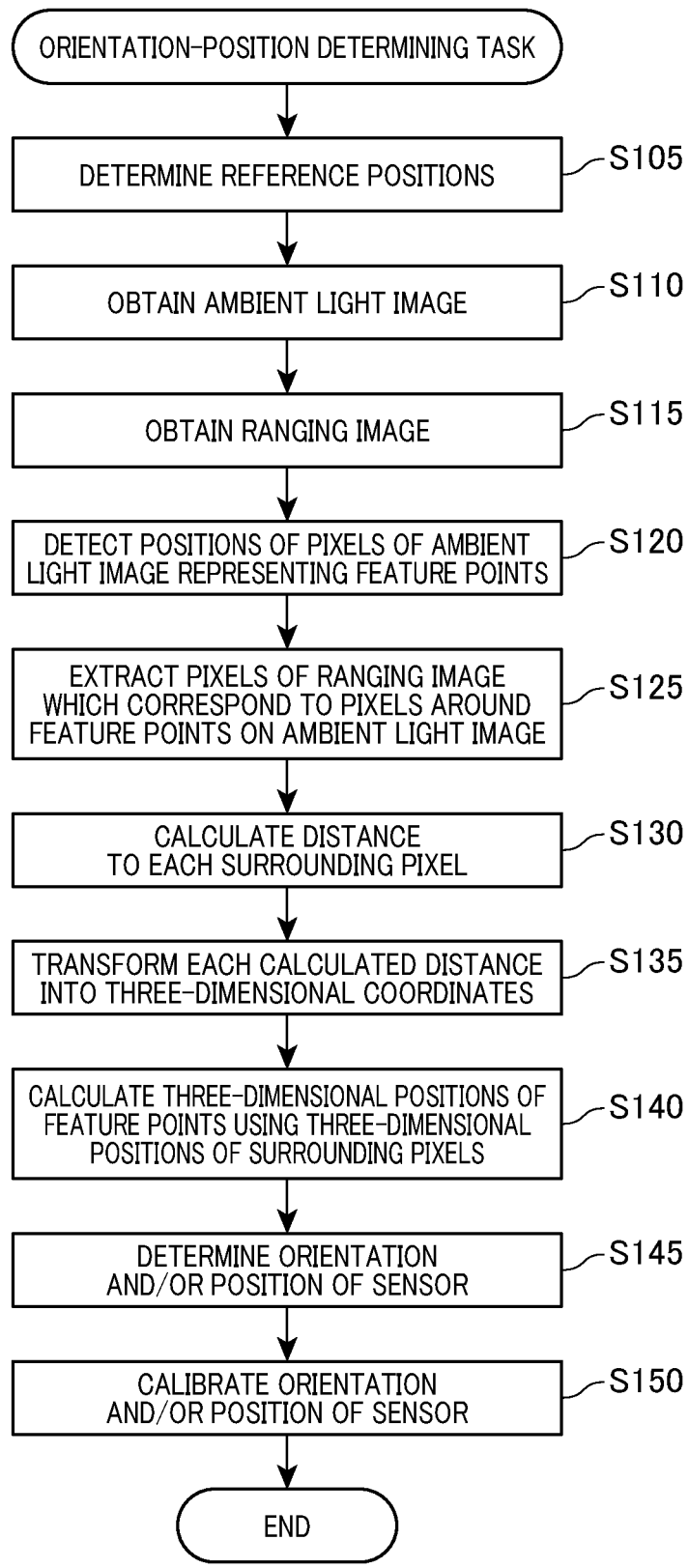
FIG. 8 is a flowchart which shows a sequence of steps of an orientation-position determining task.

FIG. 8 illustrates an orientation-position determining task or logical program for the sensor 50 which is stored in the memory 30 and executed by the CPU 20. The orientation-position determining task is performed to adjust the orientation and/or the position of the sensor 50 in an inspection line prior to shipment of the vehicle 100.

The orientation-position detector 23 determines the reference positions (step S105). Specifically, the orientation-position detector 23 detects the feature points Fp on the targets TG using the measuring device 300 to calculate the reference positions. The orientation-position detector 23 may store the reference positions in the memory 30.

The imaging unit 21 derives the ambient light image HI from the sensor 50 (step S110). The imaging unit 21 also derives the ranging image KI from the sensor 50 (step S115).

The orientation-position detector 23 detects positions of the pixels of the ambient light image HI which represent the feature points Fp on the targets TG (step S120). Specifically, the orientation-position detector 23 extracts the pixels of the ambient light image HI which represent corners of the targets TG using, for example, the Harris corner detector.

Figure 9:
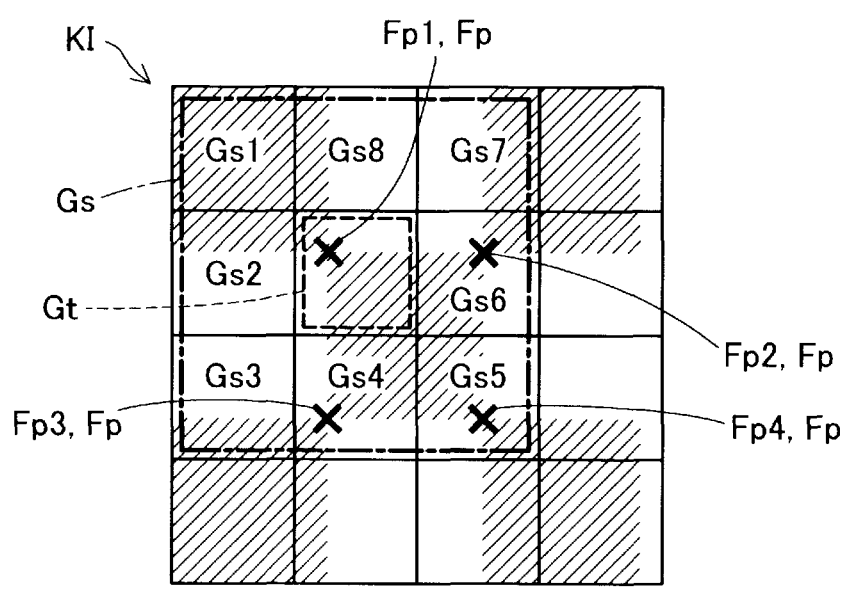
FIG. 9 is an explanatory view which shows a corresponding pixel and surrounding pixels.

The orientation-position detector 23 detects positions of the pixels (which will also be referred to below as corresponding pixels) of the ranging image KI which corresponds to the pixels of the ambient light image HI which represent the feature points Fp on the target TG and also extracts the pixels (which will also be referred to below as surrounding pixels) of the ranging image KI which are located around the corresponding pixels (step S125). Specifically, the orientation-position detector 23 first extracts from the ranging image KI the corresponding pixel Gt, as enclosed by a broken line in FIG. 9, which represents one of the feature points Fp, e.g., the feature point Fp1. Subsequently, the orientation-position detector 23 extracts the surrounding pixels Gs, as enclosed by an alternate long and short dash line in FIG. 9, which lies around the corresponding pixel Gt. More specifically, the orientation-position detector 23 extracts, as the surrounding pixels Gs, the pixels Gs1, Gs2, Gs3, Gs4, Gs5, Gs6, Gs7, and Gs8 which surround the periphery of the corresponding pixel Gt and exist adjacent to the corresponding pixel Gt. Similarly, the orientation-position detector 23 extracts from the ranging image KI the corresponding pixels Gt and the surrounding pixels Gs for the features Fp (e.g., features Fp2, Fp3, and Fp4 demonstrated in FIG. 9) on the target TG. The orientation-position detector 23 extracts more than one of the surrounding pixels Gs around the corresponding feature point Fp from one of the targets TG. The extraction of the corresponding pixels Gt, in other words, the correspondence between the positions of the pixel on the ambient light image HI and the positions of the pixels on the ranging image KI may be derived easily using the pixel sizes and the pixel positions thereof because overlapping regions of the ambient light image HI and the ranging image KI occupy the same region in a three-dimensional space. In the following discussion, when it is required to identify between the feature points on each target TG, they will be refereed to as the feature points Fp1, Fp2. If not, they will be generally referred to as the features Fp. Similarly, when it is required to identify between the surrounding pixels, they will be referred to as the surrounding pixels Gs1, Gs2. If not, they will be generally referred to as the surrounding pixels Gs. In the example in FIG. 9, the surrounding pixels Gs consist of a single array of the pixels (i.e., a total of eight pixels) abutting the corresponding pixel Gt, but however, two arrays of the pixels (i.e., a total of twenty-four pixels) or three arrays of the pixels (i.e., a total of forty-eight pixels) lying around the corresponding pixel Gt may alternatively be defined as the surrounding pixels Gs.

Referring back to FIG. 8, the orientation-position detector 23 calculates the distance to each of the surrounding pixels Gs (step S130). Specifically, the orientation-position detector 23 derives the pixel values of the surrounding pixels Gs1, Gs2, Gs3, Gs4, Gs5, Gs6, Gs7, and Gs8 on the ranging image KI to calculate the distances to them which will also be referred to as surrounding-point distances.

The orientation-position detector 23 transforms each of the surrounding-point distances into three-dimensional coordinates (step S135). Specifically, the orientation-position detector 23 performs a known coordinate transformation from polar to Cartesian coordinates. This obtains positions of the corresponding pixels Gt and the surrounding pixels Gs on the ranging image KI in a three-dimensional space (which will also be referred to below as three-dimensional surrounding point positions).

The orientation-position detector 23 uses the three-dimensional positions of the surrounding pixels Gs to calculate three-dimensional positions of the feature points Fp (step S140). Specifically, since each target TG is flat, the orientation-position detector 23 is enabled to perform the interpolation of the three-dimensional positions of the surrounding pixels Gs derived from the corresponding target TG to calculate the three-dimensional positions of the feature points Fp (which will also be referred to below as three-dimensional corresponding-point positions). A determination of whether the surrounding pixels Gs have been derived from a corresponding one of the targets TG is made in the following manner. When a difference between a three-dimensional distance to the corresponding pixel Gt and a three-dimensional distance to each of the surrounding pixels Gs is identical with a predetermined threshold value (e.g., 0.3 meters), the corresponding one of the surrounding pixels Gs is determined as having been derived from the corresponding target TG. The use of such interpolation to determine the three-dimensional corresponding-point positions achieves calculation of the three-dimensional positions of the feature points Fp with higher accuracy (on the order of subpixels) than when three-dimensional positions of the feature points Fp are derived using three-dimensional positions of the corresponding pixels Gt on the ranging image KI. The interpolation may be achieved using, for example, the nearest neighbor algorithm, the bilinear algorithm, or the bicubic algorithm.

The orientation-position detector 23 determines the orientation and/or the position of the sensor 50 (step S145). Specifically, the orientation-position detector 23 links the three-dimensional positions of the feature points Fp, derived by the sensor 50, with the reference positions derived by the measuring device 300 using the three-dimensional positions of the feature points Fp obtained by the sensor 50 and their gradient information by means of the nearest neighbor algorithm or the global nearest neighbor algorithm to produce correspondences (i.e., congruent points) therebetween. The orientation-position detector 23 then calculates the orientation and position of the sensor 50 in the coordinate system defined by reference coordinate axes using the four or more congruent points according to equation (1) below.

$$X'=RX+T \quad (1)$$

where R is the orientation, and T is the position. The orientation R is expressed by 3×3 rotation matrixes. The position T (i.e., three-axes positional deviations from the reference positions) is expressed by a 3×1 matrix. X denotes the three-dimensional positions of the feature points Fp derived by the sensor 50. X' denotes the reference positions derived by the measuring device 300. The linking of the three-dimensional positions of the feature points Fp with the reference positions may be achieved by printing markers on corners of each target TG and detecting the markers to derive positional relations (i.e., correspondences) between the three-dimensional positions and the reference positions.

The calibrator 25 calibrates or corrects the orientation and/or the position of the sensor 50 (step S150). Specifically, the calibrator 25 performs a calibration or aiming task to use the orientation and position derived in the above manner to physically regulate the orientation and position of the sensor 50 or calculate differences between the derived orientation and a predetermined reference orientation of the sensor 50 and between the derived position and a predetermined reference position of the sensor 50 to correct outputs from the sensor 50 using the calculated differences.

The above-described orientation-position determining device 10 in the first embodiment uses the targets TG each of which has the predesigned detection pattern KP on the flat surface thereof, thereby enhancing the accuracy in detecting the position of the feature points Fp on the targets TG. The orientation-position detector 23 works to detect the positions of the features Fp of the targets TG in the ambient light image HI, calculate the three-dimensional corresponding-point positions that are three-dimensional positions of the corresponding pixels Gt on the ranging image KI which are associated with the positions of the feature points Fp by interpolating the three-dimensional surrounding point positions that are three-dimensional positions of the surrounding pixels Gs lying around the corresponding pixels Gt on the ranging image KI, and determine the orientation and position of the sensor 50 using the calculated the three-dimensional corresponding-point positions. This results in enhanced accuracy in determining the three-dimensional positions of the feature points Fp, as compared with use of only the ranging image KI to calculate the three-dimensional positions of the feature points Fp, thereby obtaining the three-dimensional corresponding-point positions with high accuracy to determine the orientation and position of the sensor 50 with high accuracy.

Second Embodiment

An orientation-position determining system for the sensor 50 in the second embodiment is different from the orientation-position determining system 500 in the first embodiment in that the orientation-position determining device 10 is mounted in the vehicle 100. Other arrangements of the orientation-position determining system are substantially identical with those in the first embodiment. The same reference numbers as in the first embodiment will refer to the same parts, and explanation thereof in detail will be omitted here.

The orientation-position determining task in the first embodiment is executed in the inspection line prior to shipment of the vehicle 100, but however, the second embodiment performs the orientation-position determining task during traveling of the vehicle 100 after shipped. The second embodiment, therefore, uses structural objects on a road on which the vehicle 100 is moving as the targets TG.

Figure 10:
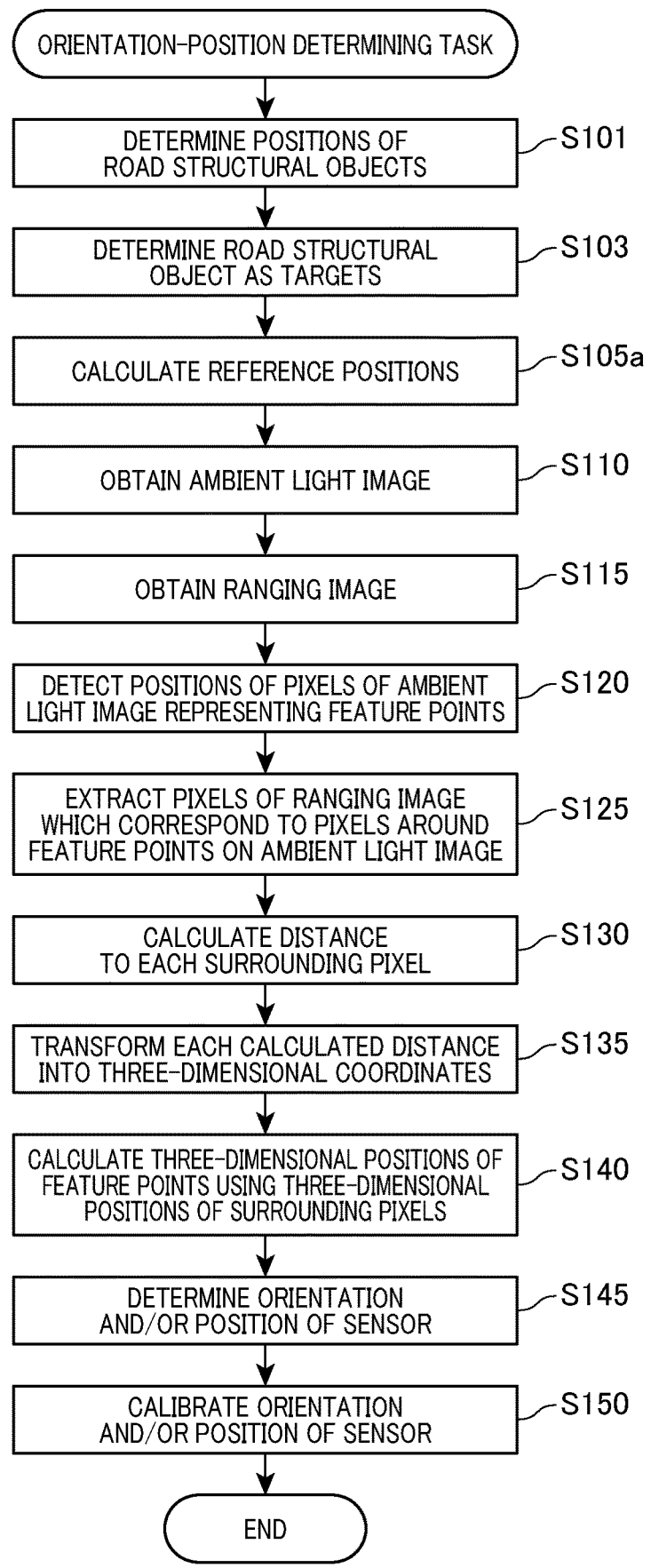
FIG. 10 is a flowchart which shows a sequence of steps of an orientation-position determining task in the second embodiment.

The orientation-position determining task in the second embodiment is, as illustrated in FIG. 10, different from that in the first embodiment in that steps S101 and S103 are additionally performed, and step S105a is performed instead of step S105. Other steps are identical with those in the first embodiment. The same step numbers as those in the first embodiment will refer to the same operations, and explanation thereof in detail will be omitted here.

Upon initiation of the orientation-position determining task, the orientation-position detector 23 derives positions of the road structural objects existing around the current location of the vehicle 100 (step S101). Specifically, the orientation-position detector 23 determines the current location of the vehicle 100 using a location sensor, not shown, installed in the vehicle 100. The current location of the vehicle 100 is expressed by latitude and longitude. The location sensor may be implemented by a global navigation satellite system (GNSS) or a gyroscope sensor. The current location of the vehicle 100 may alternatively be obtained using a wireless base station, such as a mobile telecommunication station or a road-to-vehicle communication system installed on the road, or using traffic and travel information delivered from a VICS (Vehicle Information and Communication System: trademark in Japan). Next, the orientation-position detector 23 refers to map information provided by a navigation device, not shown, installed in the vehicle 100 to detect the road structural objects existing around the current location of the vehicle 100. The term road structural objects, as referred to herein, are a preselected type(s) of roadside objects on or around the road, such as curbs, guard rails, road signs, traffic lights, lane markers, stop lines, and/or crosswalks. The preselected type(s) of roadside objects each have a flat surface, like stop markers, stop signs, traffic lights, lane markers, limit lines, or pedestrian crosswalk markers. The preselected type(s) of roadside objects, therefore, exclude traffic lights with snow covers or curved-surface traffic lights. The map information, as described above, is information on high-precision three-dimensional map including information about types of road structural objects, such as road signs.

Figure 11:
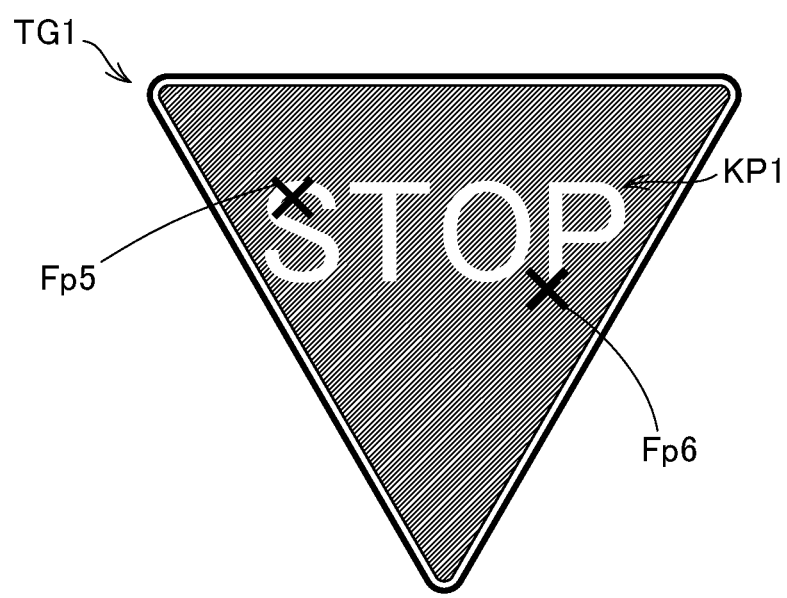
FIG. 11 is an explanatory view which illustrates an example of a target in the second embodiment.

The orientation-position detector 23 determines the road structural objects derived in step S101 as the targets TG (step S103). For instance, the target TG1 demonstrated in FIG. 11 is a stop sign equipped with the detection pattern KP1. In the example of FIG. 11, the detection pattern KP1 is illustrated as having the feature points Fp5 and Fp6 printed thereon, but however, it (i.e., the road structural object) does not actually have the feature points Fp5 and Fp6. The orientation-position detector 23, therefore, works to view edges of STOP as the feature points Fp5 and Fp6 and detect the feature points Fp5 and Fp6 on the ambient light image HI and the ranging image KI. The feature points Fp may be detected using the corner and the center of the road sign instead of edges.

The orientation-position detector 23 obtains reference positions (step S105a). Specifically, the orientation-position detector 23 uses map information to calculate three-dimensional positions of the feature points Fp in a coordinate system defined to have the origin that is set at the current location of the vehicle 100 and determines the three-dimensional positions as the reference positions. In brief, the reference positions, as referred to in the second embodiment, are three-dimensional positions of the feature points Fp derived using the high-precision three-dimensional map. After step S105a, the routine proceeds to step S110 which is identical in operation with that in the first embodiment.

As apparent from the above discussion, the orientation-position determining device 10 in the second embodiment is designed to use the target TG1 as the predetermined type of road structural object existing around the current location of the vehicle 100. The orientation-position detector 23 uses the preselected feature points on the road structural object for calculating the orientation and position of the sensor 50, thereby enabling the orientation and position of the sensor 50 to be derived accurately during traveling of the vehicle 100.

Third Embodiment

Figure 12:
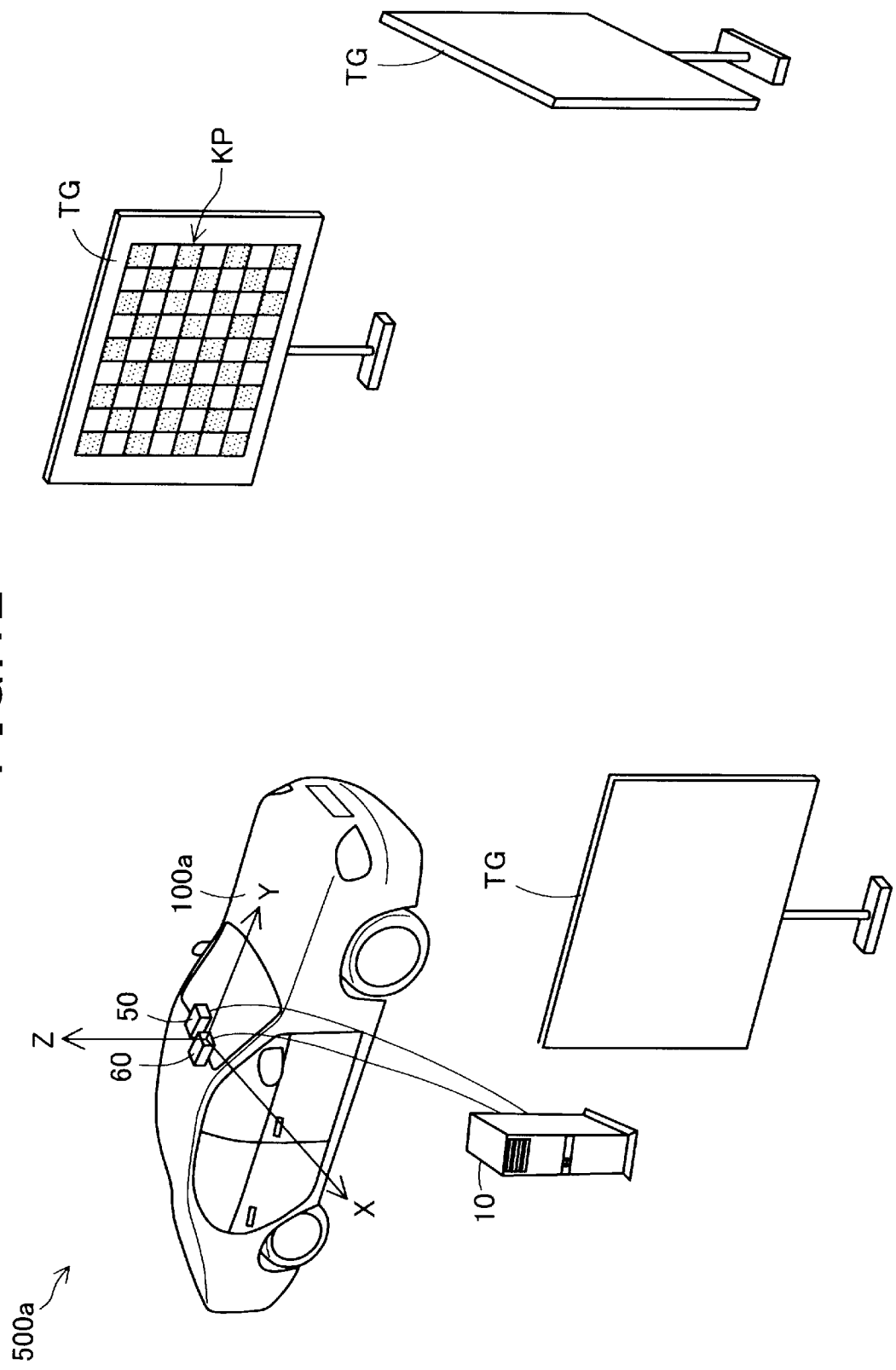
FIG. 12 is an explanatory view which schematically illustrates a structure of an orientation-position determining system according to the third embodiment.

FIG. 12 illustrates the orientation-position determining system 500a for the sensor 50 in the third embodiment is different from the orientation-position determining system 500 in the first embodiment in that it excludes the measuring device 300 and includes the vehicle 100a instead of the vehicle 100. Other arrangements of the orientation-position determining system 500a are identical with those of the orientation-position determining system 500 in the first embodiment. The same reference numbers as employed in the first embodiment will refer to the same parts, and explanation thereof in detail will be omitted here.

The vehicle 100a in the third embodiment is also equipped with the second sensor 60 which is implemented by, for example, an imaging device. The second sensor 60 may alternatively be made of a LiDAR discrete from the sensor 50. The second sensor 60 is mounted on a front portion of the roof of the vehicle 100a to have an object detection region at least partially overlapping that of the sensor 50. Such an overlap is used to calculate deviations of the orientation and position of the sensor 50 from reference coordinates axes defined by the orientation and position of the sensor 60.

Figure 13:
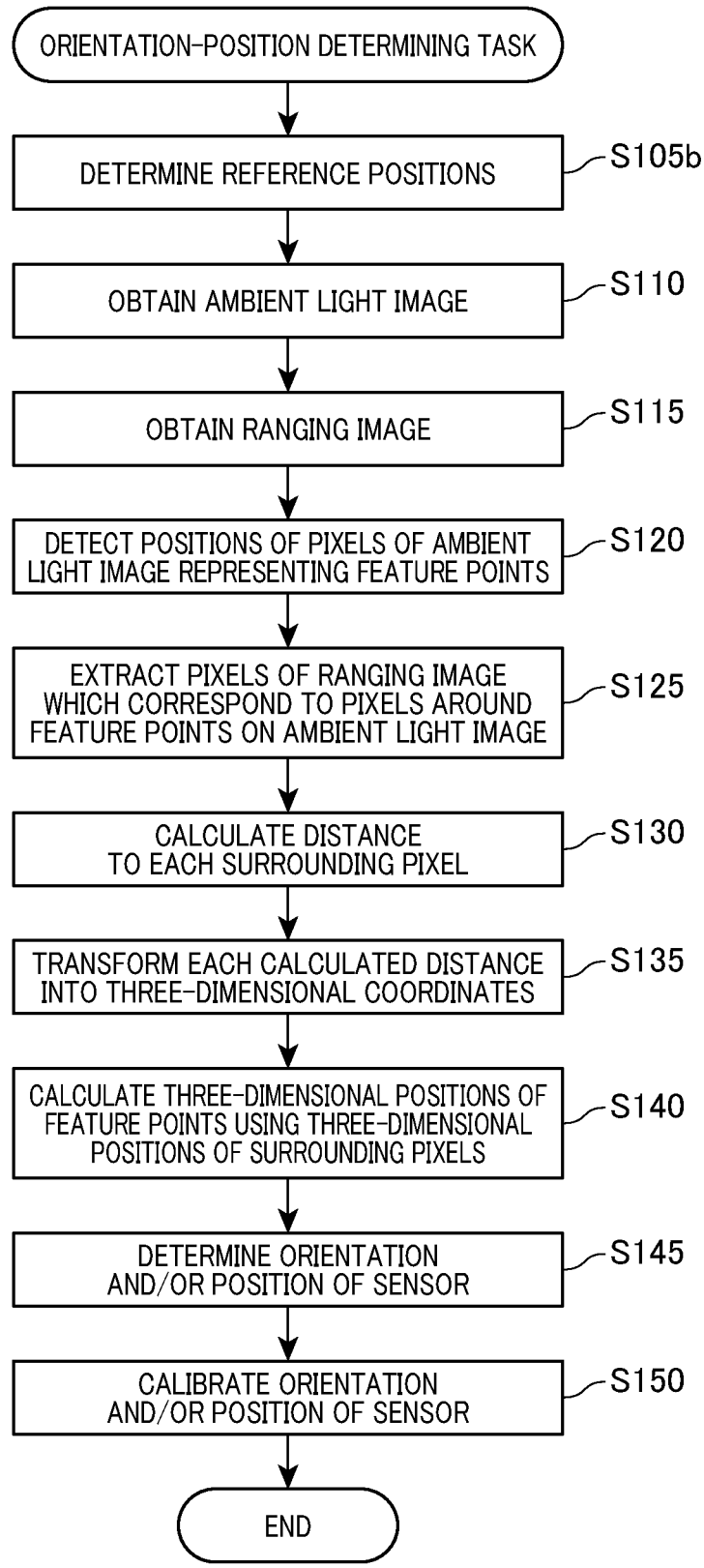
FIG. 13 is a flowchart which shows a sequence of steps of an orientation-position determining task in the third embodiment.

FIG. 13 illustrates an orientation-position determining task executed in the third embodiment which is different from that in the first embodiment in that step S105b is executed instead of step S105. A sequence of other steps is identical with that in the first embodiment. The same step numbers as employed in the first embodiment will refer to the same operations, and explanation thereof in detail will be omitted here.

Upon initiation of the orientation-position determining task in FIG. 13, the orientation-position detector 23 derives reference positions (step S105b). Specifically, the orientation-position detector 23 makes the sensor 60 detect the reference positions. The second sensor 60 acquires captured images of the targets TG to determine the orientation and position of the reference coordinate axes. More specifically, the second sensor 60 uses the above-described Harris corner detector to extract from a captured image of each of the targets TG pixels representing corners of the corresponding target TG to detect the positions of the feature points Fp as the reference positions. In other words, the reference positions, as referred to in the third embodiment, are derived by positions of pixels of an image captured by the second sensor 60 which represents the feature points Fp. After step S105b, the step S110 is performed in the manner as described above.

The orientation-position determining device 10 for the sensor 50 in the third embodiment offers substantially the same beneficial advantages as those in the first embodiment and additionally ensures the accuracy in calculating the orientation and position of the sensor 50 relative to the second sensor 60.

Other Embodiments

The orientation-position determining device 10 in each of the above embodiments may be designed not to have the calibrator 25, in other words, only to determine the orientation and position of the sensor 50.

The sensor 50 in each embodiment is implemented by a LiDAR, but may alternatively be made of a TOF (time-of-flight) camera.

Figure 14:
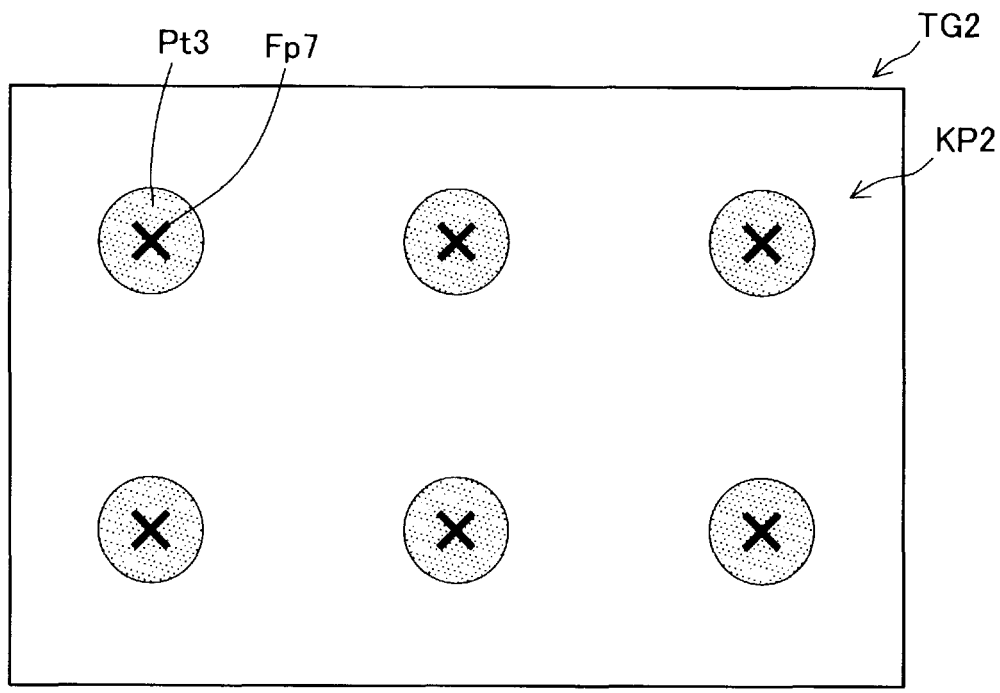
FIG. 14 is an explanatory view which illustrates another example of a target.
Figure 15:
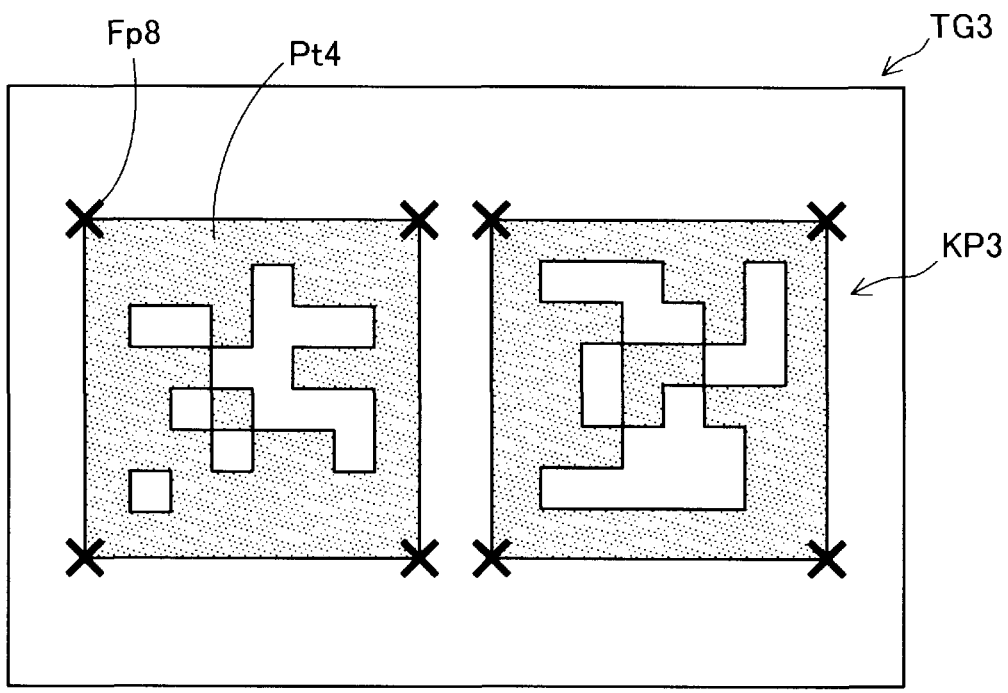
FIG. 15 is an explanatory view which illustrates another example of a target.

The targets TG or TG1 or the detection pattern KP or KP1 are not limited to the above examples. For instance, the target TG2 illustrated in FIG. 14 may be used on which the detection pattern KP2 of dots Pt3 is printed. Each of the dots Pt3 has the feature point Fp7 on the gravity center thereof. Alternatively, the target TG3 illustrated in FIG. 15 may be used which is equipped with the detection pattern KP3 of a plurality of AR markers Pt4. The AR markers Pt4 may be ArUco markers. Each of the AR markers Pt4 may have the feature points Fp8 arranged on four corners thereof.

Figure 16:
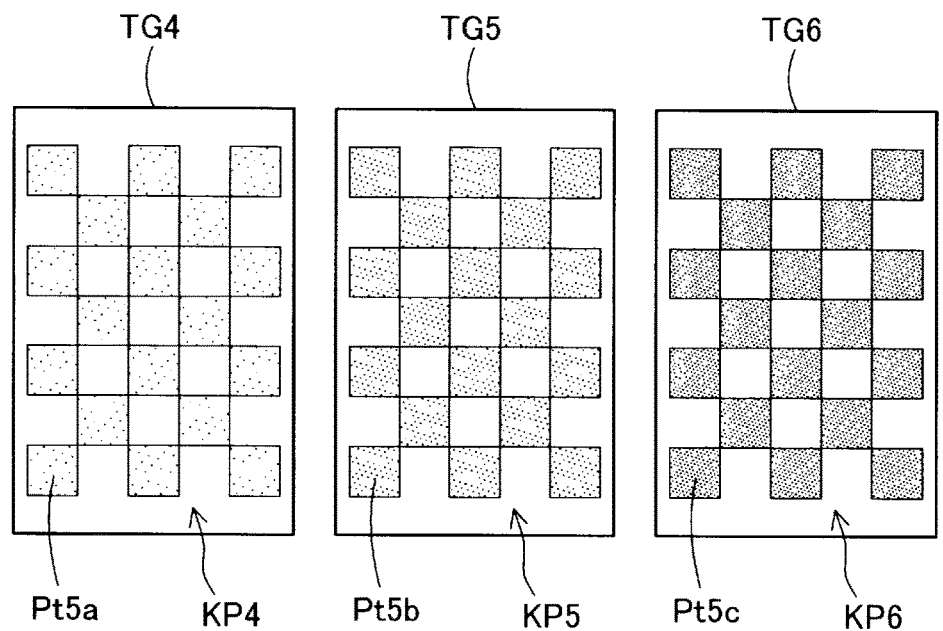
FIG. 16 is an explanatory view which illustrates another example of a target.

For instance, the targets TG may be, as illustrated in FIG. 16, designed to have the detection patterns KP which are different in color from each other. Specifically, the targets TG includes the first target TG4, the second target TG5, and the third target TG6. The first target TG4 is equipped with the detection pattern KP4. The second target TG5 is equipped with the detection pattern KP5. The third target TG6 is equipped with the detection pattern KP6. Each of the detection patterns KP4, KP5, and KP6 is of a checker board design consisting of a plurality of grids. The detection patterns KP4, KP5, and KP6 are black patterns Pt5a, Pt5b, and Pt5c which are different in color density from each other. Specifically, the color of the pattern Pt5a of the target TG4 is lower in color density than those of the pattern Pt5b of the target TG5 and the pattern Pt5c of the target TG6. The color of the pattern Pt5b is lower in color density than that of the pattern Pt5c of the target TG6. In other words, the luminance value of the pattern Pt5a is higher than those of the patterns Pt5b and Pt5c. The luminance value of the pattern Pt5b is higher than that of the pattern Pt5c.

In a case where three targets: the targets TG4, TG5, and TG6 are in the ambient light image HI, the feature points Fp of the targets TG4, TG5, and TG6 are identified or discriminated from each other by breaking down pixels of the ambient light image HI according to the luminance values of the patterns Pt5a, Pt5b, and Pt5c used as threshold brightness levels. For instance, instead of or in addition to the colors of the detection patterns KP, the detection pattern KP may be formed by kinds of material different from each other. Specifically, the detection patterns KP4, KP5, and KP6 may be designed as reflectors having degrees of reflection or reflectances different from each other. Alternatively, the targets TG may be designed according to the type of sensor 50. Specifically, when the sensor 50 is implemented by a LiDAR, the targets TG may be equipped with reflectors designed specifically for the LiDAR. When the sensor 50 is implemented by a camera, the targets TG may be equipped with the detection patterns KP having colors which facilitate accurate detection of edges of the patterns KP.

Figure 17:
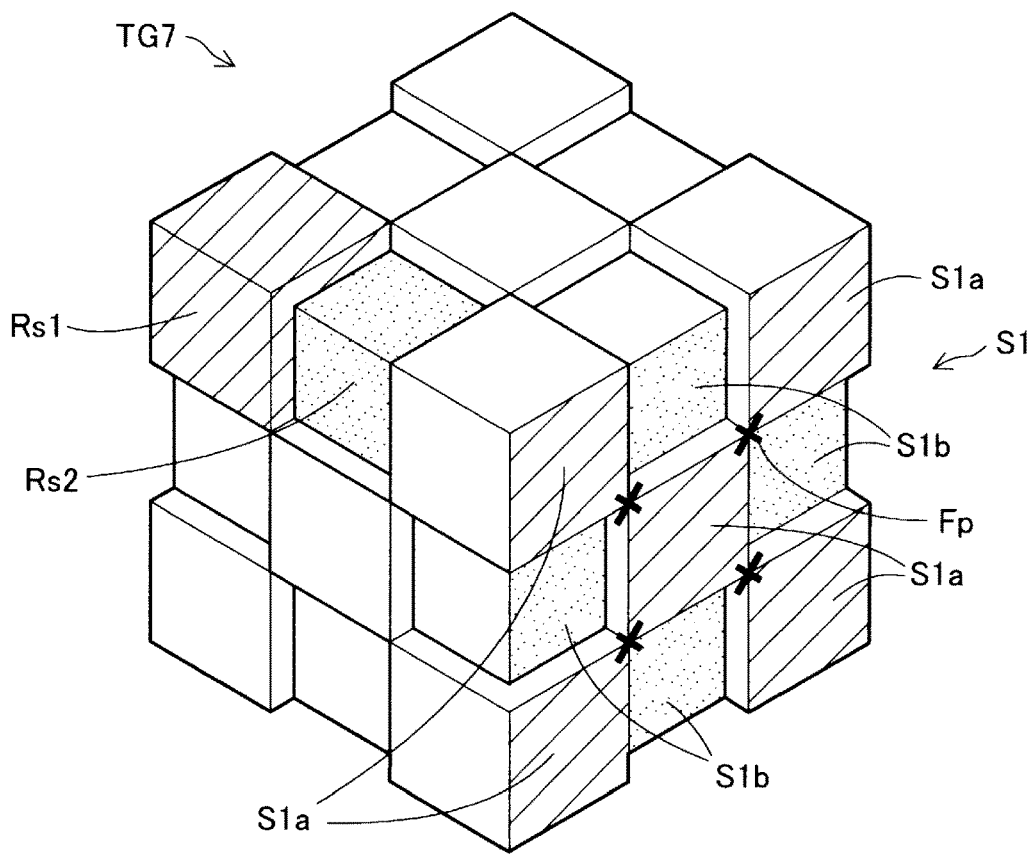
FIG. 17 is an explanatory view which illustrates another example of a target.

The targets TG in the above embodiments are each made of a flat board, but may alternatively be of a cubic shape, e.g., made of a waved board or a board with protrusions. For instance, each of the targets TG may be shaped as the target TG7 illustrated in FIG. 17. The target TG7 is of a cubic shape constructed by two types of cubic blocks: the first and second cubic blocks Rs1 and Rs2 which are different in size from each other and arranged alternately adjacent to one another, so that the cubic blocks Rs1 and Rs2 form protrusions. In other words, the target TG7 has faces S1a of the first cubic blocks Rs1 and faces S1b of the second cubic blocks Rs2. The faces S1a and S1b are arranged alternately adjacent to each other to create concave and convex areas of the outer surface S1 of the target TG7. An intersection between each of the convex faces S1a and a respective one of the concave faces S1b may be used as the feature point Fp. The detection of the feature points Fp is achieved by extracting edges of the convex faces S1a and the concave faces S1b.

In the above embodiments, the ambient light image HI has a resolution higher than that of the ranging image KI, but the ambient light image HI and the ranging image KI have resolutions equal to each other. The use of the ambient light image HI to detect the feature points Fp enables an increased number of objects to be used as the targets TG. This is because use of only the ranging image KI or the reflection-intensity image RI requires detecting where distances to the targets TG are changed or materials of the targets TG are changed as the feature points Fp, but however, the use of the ambient light image HI enables the detection of the feature points Fp as long as the targets TG have textures different from each other. It is, therefore, possible to employ, as the targets TG, objects having flat surfaces or objects, such as traffic signs, sign boards, road surfaces, or markers printed on roads, each of which is made from a uniform material.

The operations of each controller referred to in this disclosure may be realized by a special purpose computer which is equipped with a processor and a memory and programmed to execute one or a plurality of tasks created by computer-executed programs or alternatively established by a special purpose computer equipped with a processor made of one or a plurality of hardware logical circuits. The controllers or operations may alternatively be realized by a combination of an assembly of a processor with a memory which is programmed to perform one or a plurality of tasks and a processor made of one or a plurality of hardware logical circuits. Computer-executed programs may be stored as computer executed instructions in a non-transitory computer readable medium. The means for performing the functions of parts of the controller need not necessarily include software, but may be realized one or a plurality of hardware devices.

The present disclosure has been described above on the basis of embodiments and modifications, but the embodiments of the invention described above are for facilitating the understanding of the present disclosure and do not limit the present disclosure. The present disclosure can be modified and improved without departing from the drift and the scope of the claims, and the present disclosure includes equivalents thereof. For example, technical features in the embodiments and the modifications, corresponding to the technical features in each embodiment described in the section of Summary of the invention can be adequately replaced or combined in order to solve part or all of the problems mentioned above, or in order to achieve some or all of the effects mentioned above. Further, unless the technical features are described as essential in the present specification, they can be deleted as appropriate.

What is claimed is:

1. An orientation-position determining apparatus for a sensor installed in a vehicle, comprising:
   an imaging unit which obtains a ranging image and an ambient light image at different times from the sensor, the ranging image representing a distance to a target lying in a light emission range to which light is emitted from the sensor, the ambient light image representing an intensity of ambient light and having a resolution higher than or equal to that of the ranging image; and
   an orientation-position detector which is configured to use the ranging image and the ambient light image to detect an orientation and/or a position of the sensor,
   wherein
   the target includes a target which is used in determining the orientation and/or the position and equipped with a predetermined detection pattern on a flat surface of the target,
   the orientation-position detector is configured to detect a position of a pixel of the ambient light image which represents a feature point arranged on the target,
   a three-dimensional corresponding-point position is derived from a pixel value of a corresponding pixel that is a pixel of the ranging image which corresponds to the position of the pixel representing the feature point, and
   the three-dimensional corresponding-point position is used to determine the orientation and/or the position of the sensor.

2. The orientation-position determining apparatus as set forth in claim 1, wherein the orientation-position detector obtains three-dimensional surrounding point positions of surrounding pixels that are pixels of the ranging image which lie around the corresponding pixel of the ranging image using pixel values of the surrounding pixels, and
   the three-dimensional corresponding-point position is calculated by interpolating the three-dimensional surrounding point positions.

3. The orientation-position determining apparatus as set forth in claim 1, wherein the target includes a plurality of targets which are different in at least one of color and material from each other.

4. The orientation-position determining apparatus as set forth in claim 1, wherein the target includes a preselected type of road structural object lying around a current location of the vehicle, and
   the orientation-position detector uses the feature point arranged on the road structural object to determine the orientation and/or the position of the sensor.

5. The orientation-position determining apparatus as set forth in claim 1, further comprising a calibrator which is configured to calibrate the sensor.

6. The orientation-position determining apparatus as set forth in claim 1, wherein the sensor includes a plurality of light sensitive devices which receive incident light including reflected light arising from reflection of the light emitted from the sensor, and the light sensitive devices are made of single-photon avalanche diodes which output light levels as functions of light-received conditions of photosensitive elements.

7. The orientation-position determining apparatus as set forth in claim 1, wherein the sensor is implemented by a LiDAR.

8. A method for detecting an orientation and/or a position of a sensor installed in a vehicle comprising:
   obtaining a ranging image and an ambient light image at different times from the sensor, the ranging image representing a distance to a target lying in a light emission region to which light is emitted from the sensor, the ambient light image representing an intensity of ambient light and having a resolution higher than or equal to that of the ranging image; and
   detecting an orientation and/or a position of the sensor using the ranging image and the ambient light image, wherein
   the target includes a target which is used in determining the orientation and/or the position and equipped with a predetermined detection pattern on a flat surface of the target,
   a position of a pixel of the ambient light image is detected, which represents a feature point arranged on the target,
   a three-dimensional corresponding-point position is derived from a pixel value of a corresponding pixel that is a pixel of the ranging image which corresponds to the position of the pixel representing the feature point, and
   the three-dimensional corresponding-point position is used to determine the orientation and/or the position of the sensor.

9. The method as set forth in claim 8, wherein the resolution of the ambient light image is higher than that of the ranging image.

* * * * *